(12) United States Patent
Ge et al.

(10) Patent No.: US 8,876,327 B2
(45) Date of Patent: Nov. 4, 2014

(54) LASER LIGHT SOURCE MODULE AND METHOD OF MANUFACTURING LASER LIGHT SOURCE MODULE

(75) Inventors: Xiao Tang Ge, Saitama (JP); Ryosuke Shimosawa, Saitama (JP); Osami Utsuboya, Saitama (JP)

(73) Assignee: Pioneer Corporation, Kanagawa (JP)

( * ) Notice: Subject to any disclaimer, the term of this patent is extended or adjusted under 35 U.S.C. 154(b) by 45 days.

(21) Appl. No.: 13/880,852

(22) PCT Filed: Oct. 20, 2010

(86) PCT No.: PCT/JP2010/068463
§ 371 (c)(1),
(2), (4) Date: Apr. 22, 2013

(87) PCT Pub. No.: WO2012/053070
PCT Pub. Date: Apr. 26, 2012

(65) Prior Publication Data
US 2013/0208465 A1 Aug. 15, 2013

(51) Int. Cl.
*F21V 9/00* (2006.01)
*H04N 9/31* (2006.01)
*F21V 23/00* (2006.01)
*H01S 5/022* (2006.01)
*H01S 5/0683* (2006.01)
*H01S 5/40* (2006.01)
*H01S 5/323* (2006.01)

(52) U.S. Cl.
CPC ............ *F21V 23/00* (2013.01); *H01S 5/02212* (2013.01); *H01S 5/02208* (2013.01); *H01S 5/0683* (2013.01); *H01S 5/4093* (2013.01); *H04N 9/3155* (2013.01); *H04N 9/3194* (2013.01); *H01S 5/32341* (2013.01); *H01S 5/4012* (2013.01); *H04N 9/3129* (2013.01)

USPC .............................. 362/231; 398/140; 385/94

(58) Field of Classification Search
USPC .................. 362/231, 259, 326; 398/140, 141; 385/94, 89
See application file for complete search history.

(56) References Cited

U.S. PATENT DOCUMENTS

| 7,572,068 B2* | 8/2009 | Nagano et al. .................. 385/93 |
| 2006/0034571 A1* | 2/2006 | Nagano et al. .................. 385/94 |
| 2010/0061684 A1 | 3/2010 | Terada et al. |

FOREIGN PATENT DOCUMENTS

| JP | 61-131581 | 6/1986 |
| JP | 11-273138 | 10/1999 |
| JP | 2001-184706 | 7/2001 |
| JP | 2003-069125 | 3/2003 |
| JP | 2007-035884 | 2/2007 |
| JP | 3914670 | 2/2007 |
| JP | 2008-010837 | 1/2008 |
| JP | 2009-295690 | 12/2009 |

OTHER PUBLICATIONS

International Search Report, PCT/JP2010/068463, Nov. 22, 2010.

* cited by examiner

*Primary Examiner* — Ali Alavi
(74) *Attorney, Agent, or Firm* — Young & Thompson (57) ABSTRACT

A laser light source module includes a plurality of laser light sources, a synthesizing element, a light receiving element, a case unit and a sealing unit. The synthesizing element overlaps laser beams outputted from the laser light sources. The light receiving element detects the intensities of the laser beams outputted from the laser light sources. The case unit houses the laser light sources and the synthesizing element. The sealing unit seals the case unit. The light receiving element is attached to the sealing unit.

7 Claims, 8 Drawing Sheets

LASER LIGHT SOURCE MODULE AND METHOD OF MANUFACTURING LASER LIGHT SOURCE MODULE

TECHNICAL FIELD

The present invention relates to a laser light source module and a method of manufacturing the same used for a projection equipment and a head up display, for example.

BACKGROUND TECHNIQUE

Conventionally, there is known a laser light source module which outputs a laser beam. For example, Patent Reference-1 discloses a laser light source module equipped with a light receiving/emitting unit, which includes a light receiving element and a light emitting element on a metallic plate, sealed by a glass substrate on the top side and the sealing board on the lateral side. Patent Reference-2 discloses a laser light source module, which has an airtight structure for sealing interior modules such as a board and a semiconductor element, and which also has a package equipped with a lead frame for connecting the wires at the edge thereof, wherein the board and the package are bonded and sealed by structure adhesive. Patent Reference-3 discloses a laser light source module, equipped with laser diode chips, a light receiving element, a package for holding the laser diode chips and a transparent sealing member, for controlling the light outputs of the laser diode chips according to the monitor current of the light receiving element. Patent Reference-4 discloses a method of fixing each laser light source after the positioning while keeping them in chip shapes.

Patent Reference-1: Japanese Patent Application Laid-open under No. 2007-035884
Patent Reference-2: Japanese Patent Application Laid-open under No. 2003-069125
Patent Reference-3: Japanese Patent Application Laid-open under No. H11-273138
Patent Reference-4: Japanese Patent No. 3914670

DISCLOSURE OF INVENTION

Problem to be Solved by the Invention

Figure 7A:
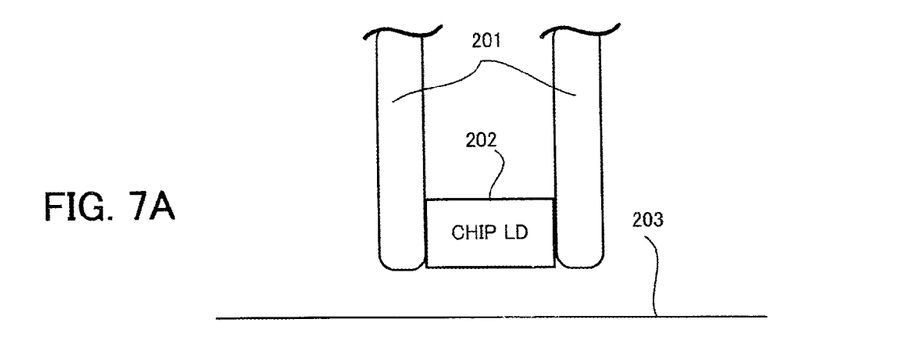
FIGS. 7A to 7C are drawings for explaining a space needed at the time of mounting the chip LD on the mounting surface.
Figure 7B:
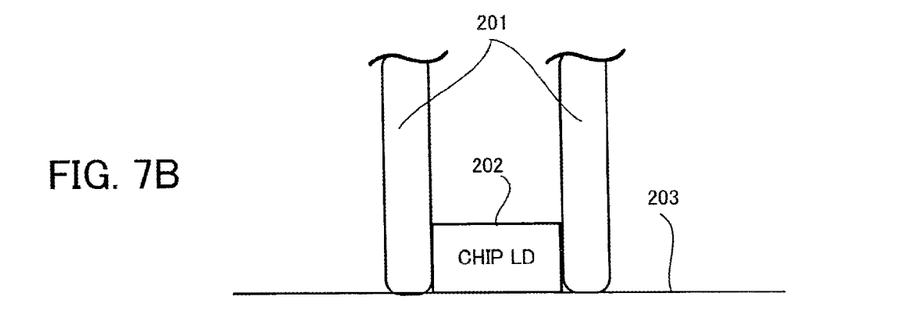
Figure 7C:
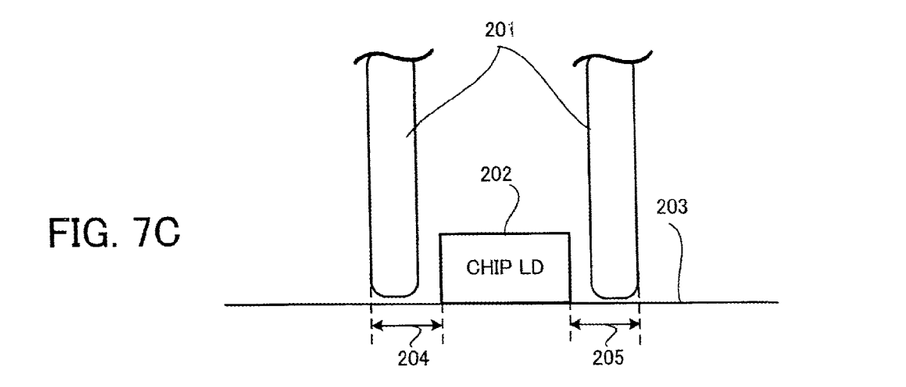

Generally, in case of mounting chips of a light emitting element and/or a light receiving element on a board (a case), it is necessary to create a space for inserting a jig such as a chuck. Concretely, as described in Patent Reference-4, if the laser light source is formed into a chip, after the positioning of the chip by a jig which holds the chip and the fixing of the chip by solder, the jig is taken away from the chip. Accordingly, it is necessary to create the space for inserting a jig and for taking the jig away from the chip. The description thereof will be given with reference to FIGS. 7A to 7C. FIGS. 7A to 7C schematically show a procedure of attaching the chip LD 202 which is a chip of the laser light source on the mounting surface 203 of the board by use of the jig 201. As shown in FIG. 7C, in this case, it is necessary to create a space corresponding to the arrow 204 and the arrow 205 in addition to the width of the chip LD 202.

Figure 8A:
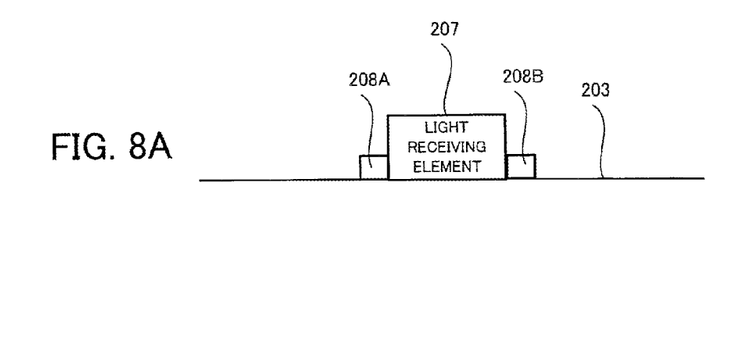
FIGS. 8A to 8C are drawings for explaining a space needed at the time of attaching the chip LD and the light receiving element on the same board.

Additionally, in order to attach a light receiving element to a case, convex portions for fixing the light receiving element are necessary as shown in FIG. 8A. FIG. 8A shows the light receiving element 207 attached on the mounting surface 203 and the convex portions 208A and 208B for fixing the light receiving element 207.

Figure 8B:
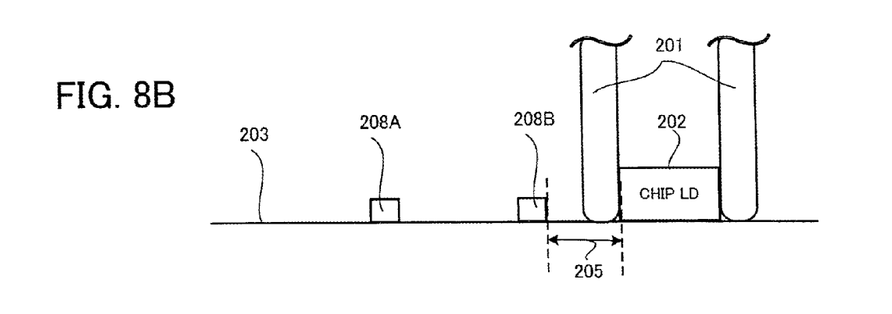
Figure 8C:
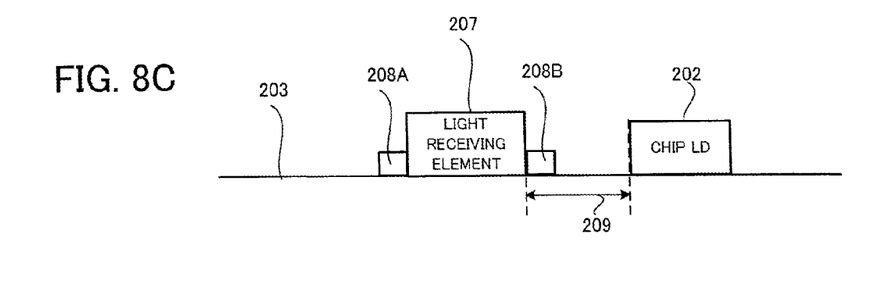

In consideration of the above facts, the chip of the laser light source has to be attached to a position away from the convex portions in order to keep the space for the jig, i.e., the space for inserting the jig and for taking away the jig, so that the jig does not interfere with the convex portions in case of fixing the chip of the laser light source. FIG. 8B and FIG. 8C schematically show a procedure of attaching the light receiving element 207 on the mounting surface 203 of the board on which the chip LD 202 is attached, after attaching the chip LD 202 to the board. As shown in FIG. 8B, there is a space for the jig between the convex portion 208B and the chip LD 202 by the width corresponding to the arrow 205. Thus, as shown in FIG. 8C, in case of attaching the light receiving element 207 on the mount surface 203 of the board on which the chip LD 202 is mounted, it is necessary to create a space between the light receiving element 207 and the chip LD 202 by the width (see the arrow 209) corresponding to the sum of the width shown by the arrow 205 and the width of the convex portion 208B.

When the light receiving element is sealed with other chips, the lead frame functioning as current pathways of the light receiving element is necessary. In this case, further space therefor is necessary.

The above is an example of the problem to be solved by the present invention. An object of the present invention is to provide a compactible laser light source module equipped with a light receiving element and the method of manufacturing the above laser light source module.

Means for Solving the Problem

One invention is a laser light source module comprising: laser light sources each of which has a different wavelength; a synthesizing element which overlaps laser beams outputted from the laser light sources; an output unit which outputs the laser beams overlapped by the synthesizing element; a light receiving element for monitoring the laser beams outputted from the laser light sources; a case unit which houses the laser light sources and the synthesizing element; and a sealing unit which seals the case unit, wherein the light receiving element is attached to the sealing unit.

Another invention is a method of manufacturing a laser light source module, the laser light source module comprising: laser light sources each of which has a different wavelength; a synthesizing element which overlaps laser beams outputted from the laser light sources; a light receiving element for monitoring the laser beams outputted from the laser light sources; a case unit which houses the laser light sources and the synthesizing element; and a sealing unit which seals the case unit, the laser light source module outputting the laser beams overlapped by the synthesizing element, and the method comprising: a first process in which the laser light sources and the synthesizing element are attached to the case unit; a second process in which the sealing unit is attached at a position where the sealing unit seals the case unit after the first process; and a third process in which the light receiving element is attached to the sealing unit after the second process.

DETAILED DESCRIPTION OF THE PREFERRED EMBODIMENTS

According to a preferable embodiment of the present invention, a laser light source module includes laser light sources each of which has a different wavelength; a synthesizing element which overlaps laser beams outputted from the laser light sources; an output unit which outputs the laser beams overlapped by the synthesizing element; a light receiving element for monitoring the laser beams outputted from the laser light sources; a case unit which houses the laser light sources and the synthesizing element; and a sealing unit which seals the case unit, wherein the light receiving element is attached to the sealing unit.

The above laser light source module includes a plurality of laser light sources, a synthesizing element, an output unit, a light receiving element, a case unit and a sealing unit. The synthesizing element overlaps laser beams outputted from the laser light sources. The output unit outputs the laser beams overlapped by the synthesizing element. The light receiving element detects the intensities of the laser beams outputted from the laser light sources. The case unit houses the laser light sources and the synthesizing element. The sealing unit seals the case unit. The light receiving element is attached to the sealing unit.

According to the above embodiment, because the light receiving element is attached to the sealing unit, any space for a jig needed at the time of mounting the light receiving element on the case unit is unnecessary. Thus, it is possible to downsize the laser light source module.

In one mode of the laser light source module, the laser light source module further comprises a condenser lens which focuses the laser beams to let the laser beams enter the light receiving element, wherein the condenser lens is attached to the sealing unit. In this mode, since the laser beams enter the light receiving element through the condenser lens which has a light-collecting property, it is possible to increase the light receiving efficiency. In addition, because the condenser lens is attached to the sealing unit, it is possible to save the mounting space thereof.

In another mode of the laser light source module, the laser light source module further includes a reflecting mirror for reflecting the laser beams focused by the condenser lens thereby to let the laser beams enter the light receiving element, wherein the reflecting mirror is attached to the sealing unit or formed integrally with the sealing unit. In this mode, even in a case where the synthesizing element, the condenser lens and the light receiving element are not in a linear arrangement, the light receiving element can receive the laser beams through the reflection of the laser beams by the reflecting mirror. Thus, it is possible to flexibly determine the mounting place of the light receiving element. In addition, since the reflecting mirror is attached to the sealing unit or formed integrally with the sealing unit, it is possible to save the mounting space thereof.

In another mode of the laser light source module, the sealing unit is transparent to the laser beams, and the light receiving element is attached to a position which is not sealed by the case unit and the sealing unit, and the laser light source module further includes a printed board which adheres to the light receiving element, the printed board transmitting a signal generated by the light receiving element. In this mode of the laser light source module, since the light receiving element is attached to a position where the light receiving element is not sealed, the light receiving element and the printed board are directly and electrically connected. Thus, in this mode, the laser light source module does not need any lead frame. Thereby, it is possible to further downsize the laser light source module.

In another mode of the laser light source module, the sealing unit has a concave portion on an opposite surface of a surface facing the case unit, and the printed board adheres to the opposite surface over the concave portion so that the light receiving element is housed in the concave portion. In this mode, it is possible to adjust the position of the light receiving element without bending the printed board thereby to decrease the stress of the printed board. By housing the light receiving element in the concave portion, it is possible to effectively use the space in the case unit thereby to downsize the laser light source module.

According to a preferable embodiment of a method of manufacturing a laser light source module, the laser light source module includes laser light sources each of which has a different wavelength; a synthesizing element which overlaps laser beams outputted from the laser light sources; a light receiving element for monitoring the laser beams outputted from the laser light sources; a case unit which houses the laser light sources and the synthesizing element; and a sealing unit which seals the case unit, the laser light source module outputting the laser beams overlapped by the synthesizing element, and the method includes a first process in which the laser light sources and the synthesizing element are attached to the case unit; a second process in which the sealing unit is attached at a position where the sealing unit seals the case unit after the first process; and a third process in which the light receiving element is attached to the sealing unit after the second process.

According to the above manufacturing method, after the laser light source and the synthesizing element are attached, the sealing unit is attached to the case unit. After these processes, the light receiving element is attached to the sealing unit. Thereby, the space for a jig needed at the time of attaching the light receiving element to the case unit is unnecessary. In addition, since the light receiving element is not sealed, any lead frame is unnecessary. Thus, the manufacturing of the laser light source module based on the above manufacturing procedure can downsize the laser light source module.

Embodiment

A preferred embodiment of the present invention will be explained hereinafter with reference to the drawings.

Figure 1:
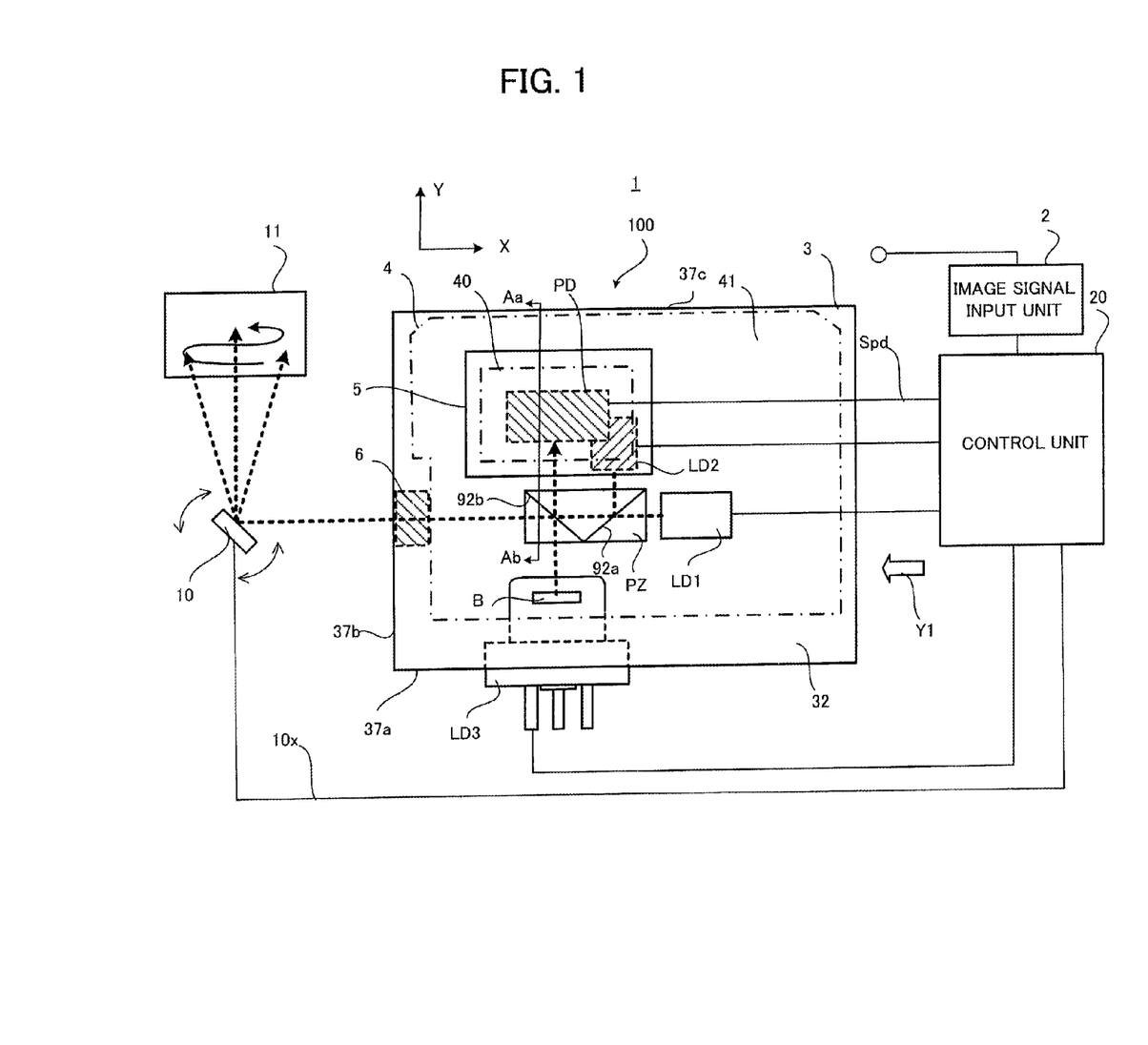
FIG. 1 shows a schematic configuration of the laser light source unit according to the embodiment.

FIG. 1 shows a schematic configuration of the laser light source unit 1 according to the embodiment. As shown in FIG. 1, the laser light source unit 1 includes an image signal input unit 2, a control unit 20, a laser light source module 100 and a MEMS mirror 10. It is noted that FIG. 1 shows the overhead view of the laser light source module 100 and shows only the exterior edge part of the transparent sealing cover 4 indicated by the alternate long and short dash line for the sake of explanation. In FIG. 1, the representative light paths of laser beams are indicated by the dashed arrows. Further, in FIG. 1, directly-invisible elements are arbitrarily shown by the dashed lines.

In summary, the Prism PZ overlaps laser beams with different wavelengths outputted by the red laser light source LD1, the green laser light source LD2 and the blue laser light source LD3, and the laser light source module 100 outputs the overlapped laser beams and detects the laser beams by the light receiving element PD. As shown in FIG. 1, the laser light source module 100 mainly includes the case unit 3, the transparent sealing cover 4, the Prism PZ, the red laser light source LD1, the green laser light source LD2, the blue laser light source LD3 (collectively referred to as "laser light source LD"), the light receiving element PD, the printed board 5 and the output lens 6.

The case unit 3 houses the Prism PZ, the red laser light source LD1, the green laser light source LD2, the blue laser light source LD3 and the output lens 6, and has the partially-opened top surface 32. The case unit 3, in a state where it is sealed by the transparent sealing cover 4, has an approximately-cuboid shape.

The transparent sealing cover 4 has an optical transparency and seals the case unit 3 from the top surface 32. The transparent sealing cover 4 has the housing unit 40 which houses the light receiving element PD, and the housing unit 40 is formed into a concave shape on the surface 41 opposite to the surface facing the case unit 3. The transparent sealing cover 4 is an example of "sealing unit" in the present invention, and the housing unit 40 is an example of "concave portion" in the present invention. The transparent sealing cover 4 will be described in detail later.

The prism (synthesizing element) PZ is a trichroic prism, for example. The prism PZ lets a part of the laser beam outputted by the red laser light source LD1 pass toward the output lens 6 and reflects the other part of the laser beam toward the light receiving element PD by the reflecting surface 92b. The prism PZ also reflects the laser beam outputted by the green laser light source LD2 toward the output lens 6 by the reflecting surface 92a and reflects a part of the reflected laser beam toward the light receiving element PD by the reflecting surface 92b. In addition, the prism PZ lets the laser beam outputted by the blue laser light source LD3 pass toward the light receiving element PD and reflects a part of the laser beam toward the output lens 6 by the reflecting surface 92b. In such a way, the Prism PZ overlaps the laser beams outputted by each laser light source LD and supplies the laser beams after the overlapping to the output lens 6 and the light receiving element PD. In the planar view shown in FIG. 1, the Prism PZ is provided between the light receiving element PD or the green laser light source LD2 and the blue laser light source LD3 in the Y-axis direction and provided between the output lens 6 and the red laser light source LD1 in the X-axis direction.

The red laser light source LD1 is a laser light source in a form of a chip, and outputs the red laser beam. The red laser light source LD1 is arranged in the case unit 3 approximately on the line, which passes through the Prism PZ and the output lens 6 set in the case unit 3 in the X-axis direction, and the red laser light source LD1 is fixed on the mounting unit 30 shown in FIG. 2 mentioned below.

The green laser light source LD2 is a laser light source in a form of a chip, and outputs the green laser beam. The green laser light source LD2 is fixed on the mounting unit 30 at a position where the outputted laser beam is reflected toward the output lens 6 by the reflecting surface 92a.

The blue laser light source LD3 is a laser light source attached to the CAN package and outputs the blue laser beam. Concretely, the blue laser light source LD3 is equipped with the semiconductor laser light source chip B which generates the blue laser beam in the CAN package, and the blue laser light source LD3 is fitted and fixed in the hole formed on the side 37a of the case unit 3. In the planar view as shown in FIG. 1, the blue laser light source LD3, the reflecting surface 92b, and light receiving element PD are set in an approximately-linear arrangement in the Y-axis direction in this order.

It is noted that the blue laser light source LD3 may be attached to a frame package. Instead of the blue laser light source LD3, the red laser light source LD1 or the green laser light source LD2 may be attached to a CAN package or a frame package. The blue laser light source LD3 may be a laser light source in a form of a chip same as the red laser light source LD1 and the green laser light source LD2 so that all the laser light sources are each in a form of chip.

The output lens 6 is a collimator lens, which changes the incoming laser beams from the Prism PZ into parallel beams to output them to the MEMS mirror 10. The output lens 6 is fitted and fixed in the hole of the side 37b, perpendicular to the side 37a equipped with the blue laser light source LD3, by UV adhesive agent for example. The output lens 6 is an example of "output unit" in the present invention.

The image signal input unit 2 receives image signals inputted from an external unit and outputs them to the control unit 20.

The MEMS mirror 10 reflects the laser beams outputted from the laser light source module 100 toward the screen 11. In order to display an image inputted to the image signal input unit 2, the MEMS mirror 10 rotates to scan the screen 11 under control of the control unit 20, and outputs the scan position information 10× (e.g. information of the angle of the MEMS mirror) at that time to the control unit 20.

The light receiving element (photodiode) PD is a light detector for monitoring intensities of the laser beams synthesized by the Prism PZ. A predetermined side of the light receiving element PD adheres to the printed board 5. The light receiving element PD is mounted in the housing unit 40. Thus, the light receiving element PD is set so that the light receiving element PD is not sealed by the case unit 3 and the transparent sealing cover 4. The light receiving element PD generates signals Spd (referred to as "detection signals" indicating current or voltage corresponding to the intensities of the incoming laser beams, and supplies the detection signals Spd to the control unit 20 through the printed board 5.

The printed board 5 is fixed at the position where the printed board 5 covers the housing unit 40 on the surface 41 of the transparent sealing cover 4 opposite to the surface facing the case unit 3. The printed board 5 is electronically connected to the control unit 20 and the light receiving element PD.

The control unit 20 includes a CPU (Central Processing Unit), a RAM (Random Access Memory), a ROM (Read Only Memory), and a frame memory, and controls the entire laser light source unit 1. For example, on the basis of the image signals inputted from the image signal input unit 2 and the scan position information 10× inputted from the MEMS mirror 10, the control unit 20 controls the driving of the MEMS mirror 10 and the laser light source LD. On the basis of the detection signals supplied from the light receiving element PD, the control unit 20 monitors qualities of the laser beams.

Figure 2:
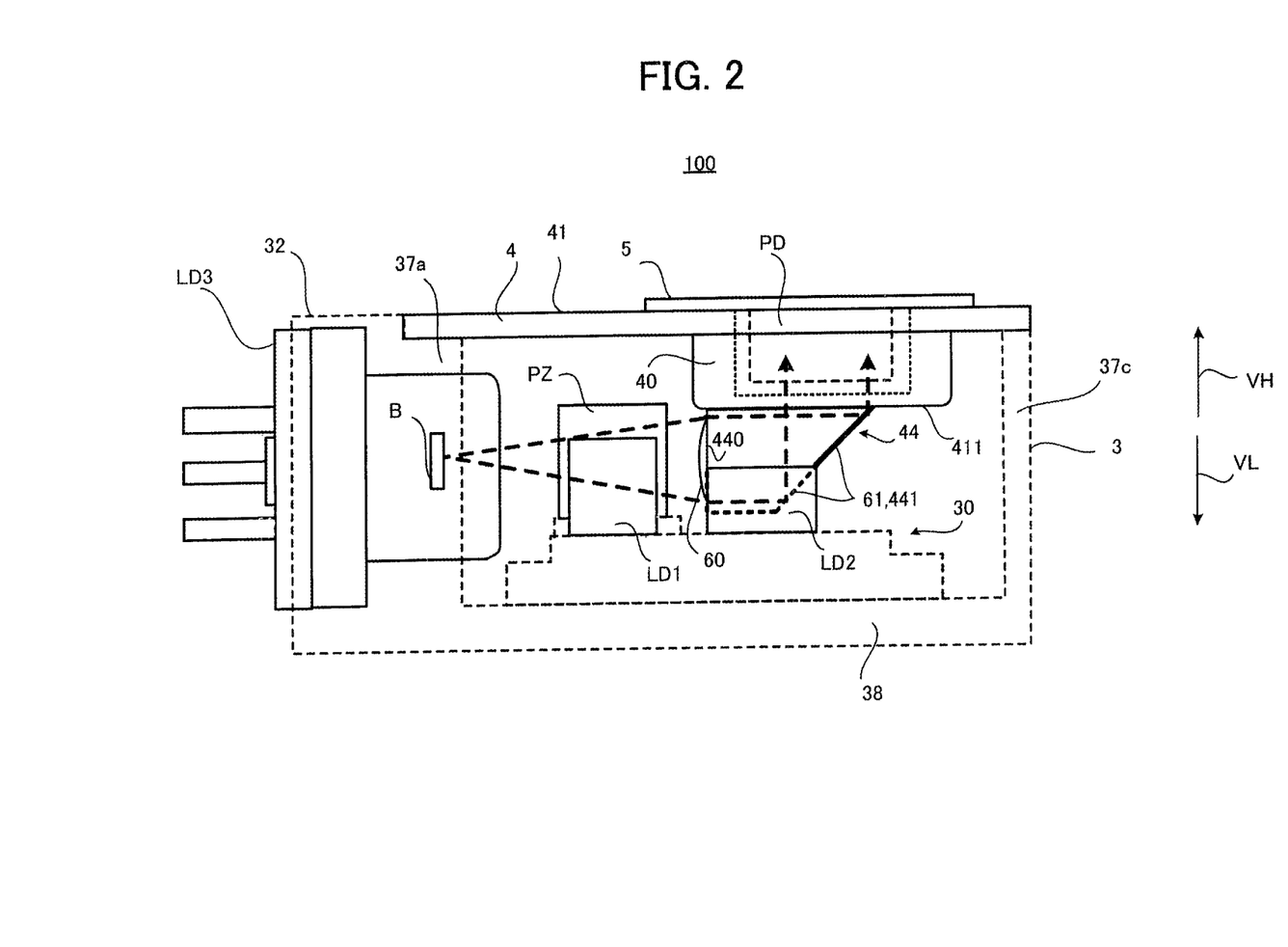
FIG. 2 shows the laser light source module observed from the direction indicated by the arrow Y1 shown in FIG. 1.
Figure 3:
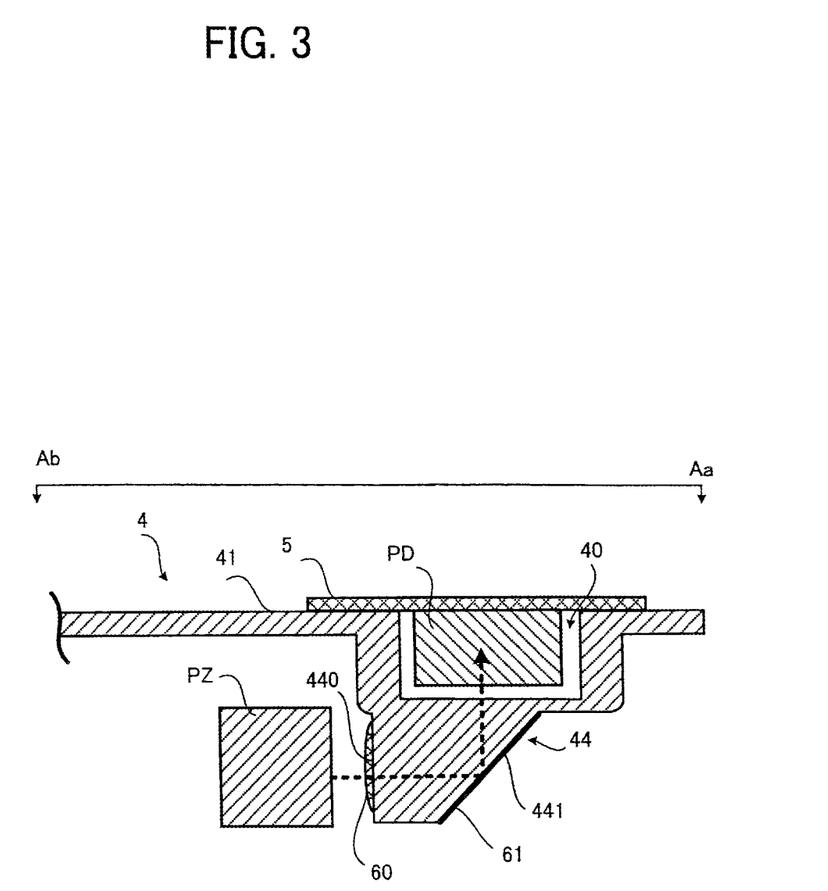
FIG. 3 is a cross-section view of the laser light source module based on the cutting plane Aa-Ab shown in FIG. 1.

Here, a detailed description of the configuration of the laser light source module 100 will be additionally given with reference to FIG. 2 and FIG. 3.

FIG. 2 shows the laser light source module 100 observed from the direction indicated by the arrow "Y1" in FIG. 1. FIG. 3 is a cross-section view of the laser light source module 100 according to the cutting plane Aa-Ab shown in FIG. 1. In FIG. 2, for the sake of explanation, the case unit 3 is transparently shown by dashed lines. Hereinafter, the vertically upward direction "VH" indicates a direction from the mounting unit 30 to the transparent sealing cover 4, and the vertically downward direction "VL" is the opposite direction to the vertically upward direction VH.

As shown in FIG. 2, at the bottom 38 of the case unit 3, there is provided the mounting unit 30 for adjusting the position of the red laser light source LD1, the green laser light source LD2 and the Prism PZ. In such a configuration, the heights, in the vertically upward direction VH, of the beams inputted/outputted from the red laser light source LD1, the green laser light source LD2 and the Prism PZ are adjusted.

As shown in FIG. 2 and FIG. 3, the transparent sealing cover 4 has the projection unit 44, to which the condenser lens 60 and the reflecting mirror 61 are fixed and which is provided on the bottom face 411 of the housing unit 40. The projection unit 44 has a hexahedral shape extending from the bottom face 411 of the housing unit 40 toward the vertically downward direction VL. The condenser lens 60 is provided on the prism facing side 440 facing the Prism PZ. The projection unit 44 has the inclined plane 441 facing the prism facing side 440, the inclined plane 441 and the bottom face 411 defining approximately 45° in the side view shown in FIG. 2. On the inclined plane 441, there is provided the reflecting mirror 61 which reflects the laser beams penetrating through the projection unit 44 from the condenser lens 60 toward the vertically upward direction VH. It is noted that the reflecting mirror 61 may be integrally formed with the inclined plane 441.

Preferably, in a state where the case 3 is sealed by the transparent sealing cover 4, the projection unit 44 and the housing unit 40 are set in a space for a jig needed at the time of mounting chips, such as the Prism PZ and the laser light source LD, on the case unit 3.

As shown in FIG. 2 and FIG. 3, the condenser lens 60 focuses the laser beams so that the laser beams outputted from the Prism PZ are directed to the reflecting mirror 61. The reflecting mirror 61 reflects the laser beams, which pass through the condenser lens 60 to the bottom face 411 in approximately parallel manner, toward the light receiving element PD existing in the vertically upward direction VH. Then, the light receiving element PD generates the detection signals Spd according to the incoming laser beams.

Here, a description will be given of main effects based on the configuration of the laser light source module 100 shown in FIGS. 1 to 3.

As shown in FIGS. 1 to 3, whereas the Prism PZ and each laser light source LD are attached to the case unit 3, the light receiving element PD is attached to the transparent sealing cover 4. Thereby, the case unit 3 does not have to have any convex portion (see the convex portions 208A, 208B shown in FIGS. 8A to 8C) for attaching the light receiving element PD and any space (see the arrow 205 shown in FIG. 7C and FIG. 8B) for the jig provided between one of the convex portion and the laser light source LD. Hence, it is possible to downsize the laser light source module 100.

Preferably, the installation positions of the transparent sealing cover 4, the light receiving element PD, the condenser lens 60 and the reflecting mirror 61 are determined to be in a space for the jig needed at the time of attaching the laser light source LD in a form of a chip to the case unit 3. Thus, it is possible to downsize the laser light source module 100.

The light receiving element PD is held in the housing unit 40 formed into a concave shape on the surface 41 of the transparent sealing cover 4, and the light receiving element PD is arranged at a position where it is not sealed in the case unit 3 by the transparent sealing cover 4. Thus, the laser light source module 100 does not need any lead frame because the light receiving element PD is directly attached to the printed board 5. As a result, it is possible to downsize the laser light source module 100 by saving the setting space of the lead frame.

In addition, the printed board 5 supports the light receiving element PD along the surface 41. In other words, the printed board 5 adheres to the light receiving element PD and it is attached to the surface 41 without being bent. Thus, in the above-mentioned embodiment, the printed board 5 is free from the bending stress.

As described above, the light receiving element PD is held in the housing unit 40 formed into a concave shape on the surface 41 of the transparent sealing cover 4. Thereby, it is possible to make an effective use of the space in the case unit 3 and to downsize the laser light source module 100.

In addition, the light receiving element PD receives the laser beams through the condenser lens 60 with a light harvesting property. Thus, the laser light source module 100 can raise the efficiency of receiving the laser beams by the condenser lens 60.

(Manufacturing Method)

Figure 4:
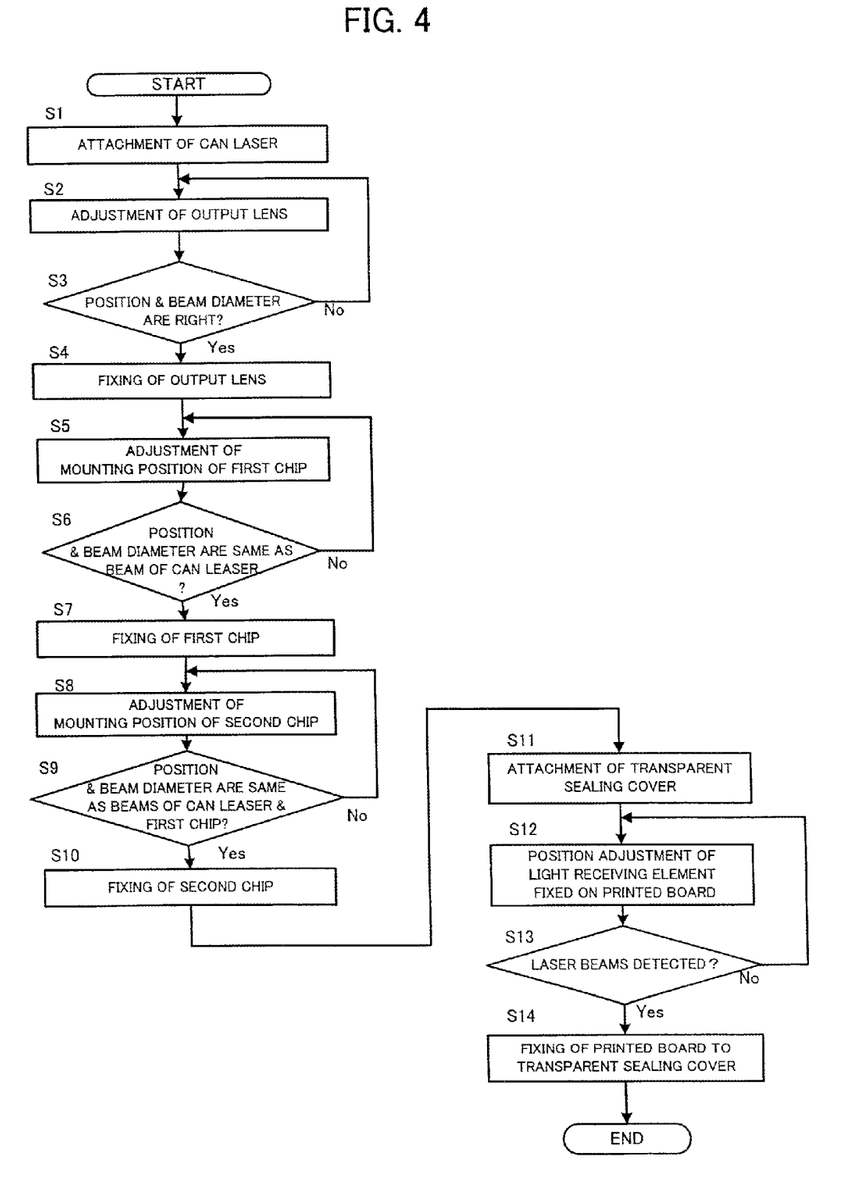
FIG. 4 shows an example of a flowchart indicating the process of manufacturing the laser light source module.

Next, the manufacturing method of the laser light source module 100 will be described with reference to FIG. 4. FIG. 4 shows an example of a flowchart indicating the process of assembling the laser light source module 100.

At first, the CAN laser (i.e., the blue laser light source LD3) is attached to the case unit 3 equipped with the Prism PZ in advance (step S1). At that time, the CAN laser is simply fixed at a predetermined mounting position in the case unit 3, and any other adjustment is not made.

Next, an adjustment is made to the mounting position of the output lens 6 with respect to the case unit 3 (step S2). Concretely, determinations are made concerning whether or not the position of the outgoing beam of the blue laser light source LD3 coincides with a target position on a target object existing outside the laser light source module 100 and whether or not the beam diameter on the target object coincides with a predetermined length. When the position of the outgoing beam coincides with the target position and the beam diameter coincides with the predetermined length (step S3; Yes), the output lens 6 is fixed at the position (step S4). On the other hand, when the position of the outgoing beam does not coincide with the target position or the beam diameter does not coincide with the predetermined length (step S3; No), the adjustment to the mounting position of the output lens 6 is continuously made at step S2.

Next, an adjustment is made to the mounting position of either the red laser light source LD1 or the green laser light source LD2 (hereinafter referred to as "first chip") with respect to the case unit 3 (step S5). Concretely, the adjustment is made, while holding the first chip with a chuck and dropping the sensing pin and lighting the first chip, so that the position and the beam diameter of the outgoing laser of the first chip on the target object coincide with these of the outgoing laser of the blue laser light source LD3. When the position and the beam diameter of the outgoing laser of the first chip on the target object coincide with these of the outgoing laser of the blue laser light source LD3 (step S6; Yes), the first chip is fixed by solder and the like (step S7). On the other hand, when the position or the beam diameter of the outgoing laser of the first chip on the target object does not coincide with these of the outgoing laser of the blue laser light source LD3 (step S6; No), the adjustment to the mounting position of the first chip is continuously made at step S5.

Next, an adjustment is made to the mounting position of either the red laser light source LD1 or the green laser light source LD2 (referred to as "second chip") which is not fixed at step S7 (step S8). Concretely, in the same way as step S5, the adjustment is made, while holding the second chip with a chuck and dropping the sensing pin and lighting the first chip, so that the position and the beam diameter of the outgoing laser of the second chip on the target object coincide with these of the outgoing lasers of the blue laser light source LD3 and the first chip. When the position and the beam diameter of the outgoing laser of the second chip on the target object coincide with these of the outgoing lasers of the blue laser light source LD3 and the first chip (step S9; Yes), the second chip is fixed by solder and the like (step S10). On the other hand, when the position or the beam diameter of the outgoing laser of the second chip on the target object does not coincide with these of the outgoing lasers of the blue laser light source LD3 or the first chip (step S9; No), the adjustment to the mounting position of the second chip is continuously made at step S8.

Next, the transparent sealing cover 4 is attached to the case unit 3 (step S11). Thereby, inside of the case unit 3 is sealed by the transparent sealing cover 4. Then, an adjustment is made to the position of the light receiving element PD fixed on the printed board 5 in advance (step S12). Concretely, while holding the light receiving element PD and the printed board 5 with a chuck and monitoring the detection signal Spd of the light receiving element PD, a determination is made concerning whether or not the laser beams synthesized by the Prism PZ are correctly detected. Thereby, the position of the light receiving element PD is adjusted so that the light receiving element PD receives the laser beams synthesized by the PZ and reflected at the reflecting mirror 61. When the laser beams are judged to be detected by the light receiving element PD (step S13; Yes), the printed board 5 is fixed on the surface 41 of the transparent sealing cover 4 through adhesive agent and the like (step S14). On the other hand, when the laser beams are judged not to be correctly detected by the light receiving element PD (step S13; No), the adjustment to the position of the light receiving element PD is continuously made at step S12.

In such a way, unlike the CAN laser, the first chip and the second chip, the position of the light receiving element PD with respect to the transparent sealing cover 4 is adjusted after the transparent sealing cover 4 is attached to the case unit 3. Thus, in this case, the inside of the case unit 3 does not need the space for a jig such as a chuck in case of attaching the light receiving element PD. Thus, it is possible to achieve the downsizing of the laser light source module 100.

(Other Configurations)

The configuration (referred to as "first configuration example") shown in FIG. 1 to FIG. 3 is merely an example, and the configuration of the laser light source module 100 to which the present invention can be applied is not limited to the configuration. Here, with reference to FIG. 5 and FIG. 6, descriptions will be given of a second configuration example and a third configuration example as other configurations of the laser light source module 100 to which the present invention can be applied. Hereinafter, the same elements as the first configuration example will accordingly be provided with the same reference numbers and the explanation thereof will accordingly be omitted.

Figure 5:
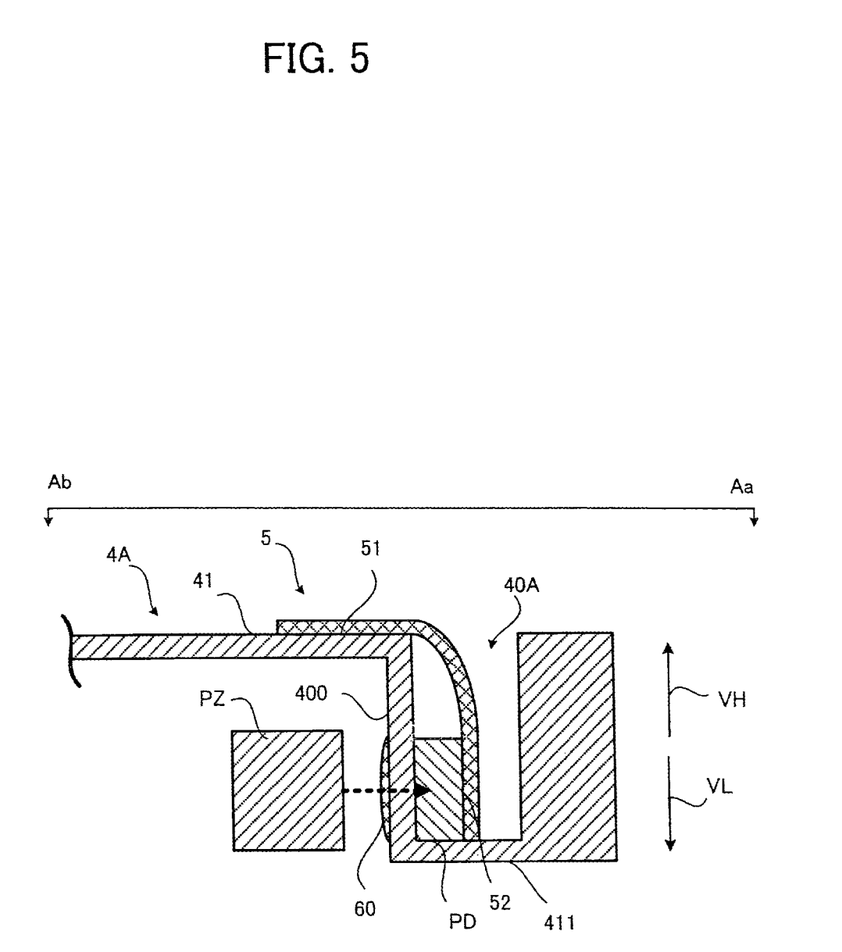
FIG. 5 is an example of a cross-section view of the laser light source module of the second configuration example corresponding to FIG. 3.

FIG. 5 is one example of a cross-section view of the laser light source module 100 of the second configuration example corresponding to FIG. 3. As shown in FIG. 5, the laser light source module 100 of the second configuration example is different from the laser light source module 100 of the first configuration example in that it does not have the reflecting mirror 61.

As shown in FIG. 5, the housing unit 40A equipped with the light receiving element PD extends to the reachable range of the outgoing beams of the Prism PZ in the vertically downward direction VL. Then, the condenser lens 60 is fixed on the prism facing side 400, which is a lateral surface of the housing unit 40A and which faces the Prism PZ. The light receiving element PD is fixed at a position in the housing unit 40A where the light receiving element PD, the Prism PZ and the condenser lens 60 are in an approximately-linear arrangement. In other words, the light receiving element PD is provided at a reachable position of the outgoing laser beams outputted from the Prism PZ and passing through the condenser lens 60.

The printed board 5 has the cover attachment part 51 adhering to the surface 41 and the photodiode attachment part 52 adhering to the light receiving element PD on the same surface. As shown in FIG. 5, the cover attachment part 51 and the photodiode attachment part 52 extend in mutually perpendicular direction. Thus, the printed board 5 is fixed in such a state that it is bent so as to extend toward the extending direction of the surface 41 and the vertically downward direction VL. The detection signals generated by the light receiving element PD are supplied to the control unit 20 through the printed board 5.

Figure 6:
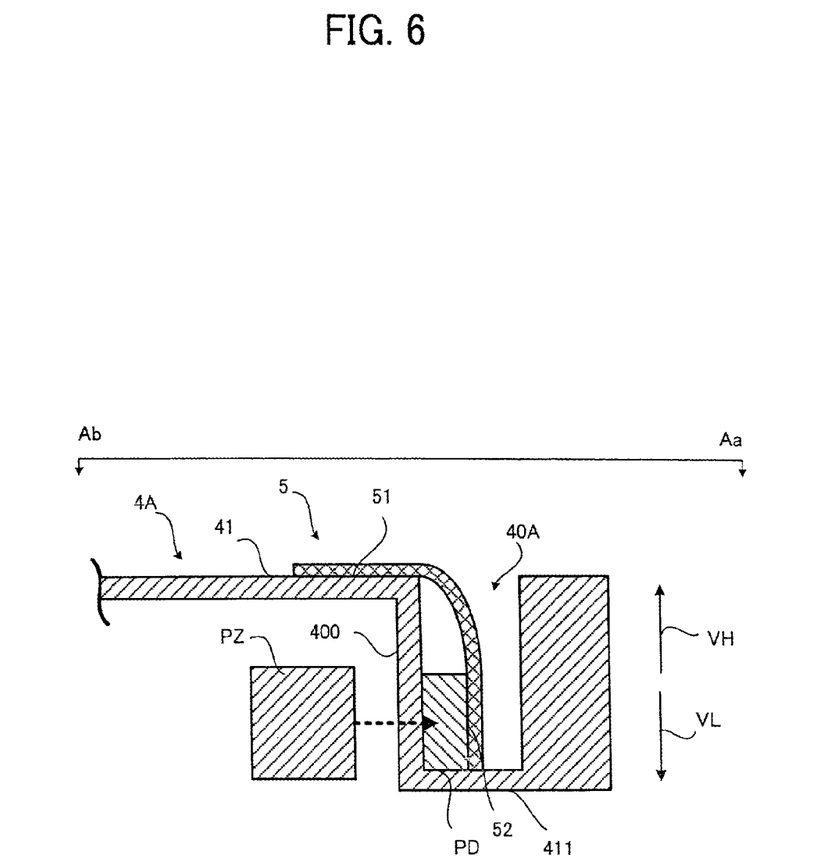
FIG. 6 is an example of the cross-section view of the laser light source module of the third configuration example corresponding to FIG. 3.

FIG. 6 is an example of the cross-section view of the laser light source module 100 of the third configuration example corresponding to FIG. 3. As shown in FIG. 6, the laser light source module 100 of the third configuration example is different from the laser light source module 100 of the first configuration example in that it does not have the condenser lens 60 and the reflecting mirror 61, and different from the laser light source module 100 of the second configuration example in that it does not have the condenser lens 60.

As shown in FIG. 6, in the third configuration example, same as the second configuration example, the light receiving element PD is fixed at a position in the housing unit 40A where the light receiving element PD, Prism PZ and the condenser lens 60 are in an approximately-linear arrangement. Then, the laser beam outputted from the Prism PZ enters the light receiving element PD through the prism facing side 400. In the same way as the second configuration example, the printed board 5 has the cover attachment part 51 adhering to the surface 41 and the photodiode attachment part 52 adhering to the light receiving element PD, and it is fixed in such a state that it is bent so as to extend toward the extending direction of the surface 41 and the vertically downward direction VL. The detection signals generated by the light receiving element PD are supplied to the control unit 20 through the printed board 5.

As described above, according to the second configuration example and the third configuration example, the transparent sealing cover 4 is equipped with the light receiving element PD, and the detection signals of the laser beams synthesized by the Prism PZ and passed through the printed board 5 directly connected to the light receiving element PD are supplied to the control unit 20. Thus, according to the second configuration example and the third configuration example, the downsizing of the laser light source module 100 is achieved since the inside of the case unit 3 also does not need any space for a jig such as a chuck needed at the time of attaching the light receiving element PD. Same as the first configuration example, the laser light source modules 100 according to the second configuration and the third configuration do not need any lead frame, so more downsizing is achieved compared to any configuration which needs a lead frame.

INDUSTRIAL APPLICABILITY

This invention can be applied to a light source unit for a head up display and other light source modules functioning as a light source in case of projecting a picture or images.

BRIEF DESCRIPTION OF REFERENCE NUMBERS

1 Laser light source unit
2 Image signal input unit
3 Case unit
4 Transparent sealing cover
5 Printed board
6 Output lens
11 Screen
20 Control unit
100 Laser light source module
LD1 Red laser light source
LD2 Green laser light source
LD3 Blue laser light source
PZ Prism
PD Light receiving element

The invention claimed is:

1. A laser light source module comprising:
at least one laser light source;
a light receiving element for monitoring a laser beam outputted from the at least one laser light source;
a case unit which houses the at least one laser light source;
a sealing unit which seals the case unit; and
an optical element for letting the laser beam enter the light receiving element,
wherein the light receiving element and the optical element are attached to the sealing unit.

2. The laser light source module according to claim 1,
wherein the at least one laser light source comprises plural laser light sources each of which has a different wavelength;
wherein the light receiving element monitors laser beams outputted from the plural laser light sources;
wherein the case unit houses the plural laser light sources;
wherein the optical element is a condenser lens which focuses the laser beams to let the laser beams enter the light receiving element.

3. The laser light source module according to claim 2, further comprising:
a synthesizing element which overlaps laser beams outputted from the plural laser light sources; and
an output unit which outputs the laser beams overlapped by the synthesizing element,
wherein the case unit houses the synthesizing element.

4. The laser light source module according to claim 2, further comprising
a reflecting mirror for reflecting the laser beams focused by the condenser lens thereby to let the laser beams enter the light receiving element,
wherein the reflecting mirror is attached to the sealing unit or formed integrally with the sealing unit.

5. The laser light source module according to claim 1,
wherein the sealing unit is transparent to the laser beams, and
wherein the light receiving element is attached to a position which is not sealed by the case unit and the sealing unit, the laser light source module further comprising
a printed board which adheres to the light receiving element, the printed board transmitting a signal generated by the light receiving element.

6. The laser light source module according to claim 5,
wherein the sealing unit has a concave portion on an opposite surface of a surface facing the case unit, and
wherein the printed board adheres to the opposite surface over the concave portion so that the light receiving element is housed in the concave portion.

7. A method of manufacturing a laser light source module, the laser light source module comprising:
at least one laser light source;
a light receiving element for monitoring a laser beam outputted from the at least one laser light sources;
a case unit which houses the at least one laser light source; and
a sealing unit which has a optical element and which seals the case unit, the optical element letting the laser beam enter the light receiving element, and
the method comprising:
a first process in which the at least one laser light sources is attached to the case unit;
a second process in which the sealing unit is attached at a position where the sealing unit seals the case unit after the first process; and
a third process in which the light receiving element is attached to the sealing unit after the second process.

* * * * *